(12) United States Patent  
Jansson

(10) Patent No.: US 8,030,972 B2  
(45) Date of Patent: Oct. 4, 2011

(54) HIGH-SPEED LATCHED COMPARATOR CIRCUIT WITH VARIABLE POSITIVE FEEDBACK

(75) Inventor: Christer Jansson, Linköping (SE)

(73) Assignee: Zoran Corporation, Sunnyvale, CA (US)

( * ) Notice: Subject to any disclaimer, the term of this patent is extended or adjusted under 35 U.S.C. 154(b) by 10 days.

(21) Appl. No.: 12/620,135

(22) Filed: Nov. 17, 2009

(65) Prior Publication Data

US 2011/0115538 A1    May 19, 2011

(51) Int. Cl.  
*G01R 19/00* (2006.01)

(52) U.S. Cl. ............ 327/54; 327/55; 327/215; 327/219; 327/228

(58) Field of Classification Search .................... 327/54, 327/55, 215, 219, 228  
See application file for complete search history.

(56) References Cited

U.S. PATENT DOCUMENTS

| | | | | |
|---|---|---|---|---|
| 4,845,675 A | * | 7/1989 | Krenik et al. | 365/203 |
| 4,973,864 A | * | 11/1990 | Nogami | 327/55 |
| 5,355,391 A | * | 10/1994 | Horowitz et al. | 375/257 |
| 5,486,785 A | | 1/1996 | Blankenship | |
| 5,903,171 A | * | 5/1999 | Shieh | 327/55 |
| 5,977,798 A | * | 11/1999 | Zerbe | 326/98 |
| 6,204,697 B1 | * | 3/2001 | Zerbe | 326/98 |

OTHER PUBLICATIONS

European Search Report, corresponding to EP 08 15 6863, date of completion of the search Oct. 27, 2008.

* cited by examiner

*Primary Examiner* — Kenneth B. Wells  
(74) *Attorney, Agent, or Firm* — Lando & Anastasi, LLP

(57) ABSTRACT

A latched comparator circuit. The latched comparator circuit comprises a first and a second output terminal for outputting a first and a second output voltage, respectively, of the latched comparator circuit. Furthermore, the latched comparator circuit comprises a cross-coupled pair of transistors operatively connected between the first and the second output terminal for providing a positive feedback in the latched comparator circuit. In addition, the latched comparator circuit comprises a reset terminal for receiving a reset signal and reset circuitry arranged to balance the first and the second output voltage during a first phase of the reset signal and allow a voltage difference to develop between the first and the second output voltage during a second phase of the reset signal. Moreover, the latched comparator circuit comprises a load unit operatively connected to the cross-coupled pair of transistors and a bias circuit arranged to receive the reset signal and to bias the load unit such that a conductivity of the load unit is higher during the second phase of the reset signal than during the first phase of the reset signal, whereby said positive feedback is stronger during the second phase of the reset signal than during the first phase of the reset signal.

13 Claims, 5 Drawing Sheets

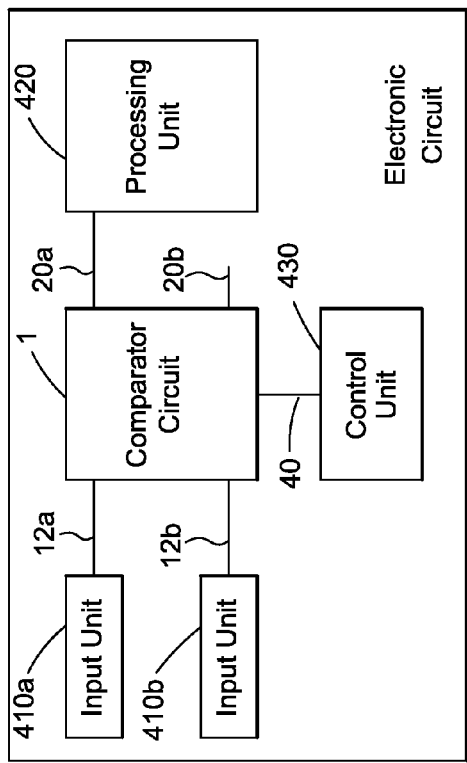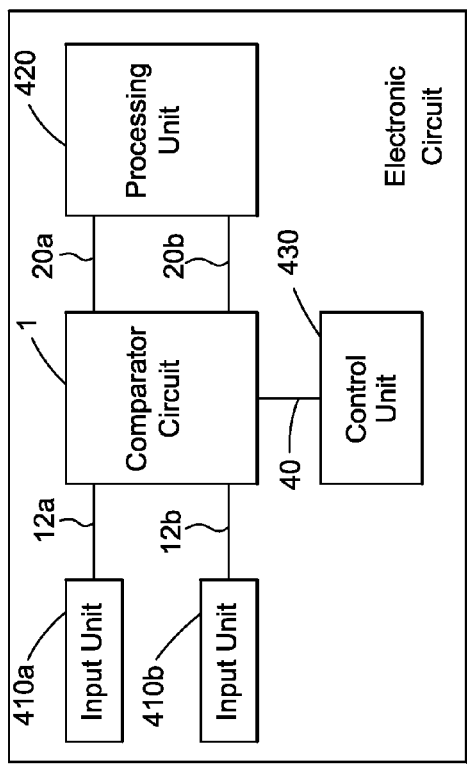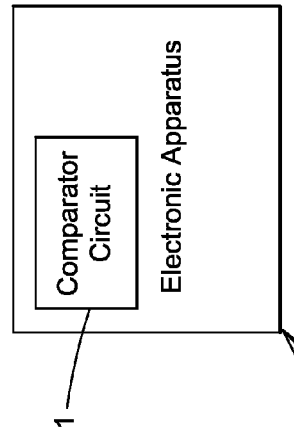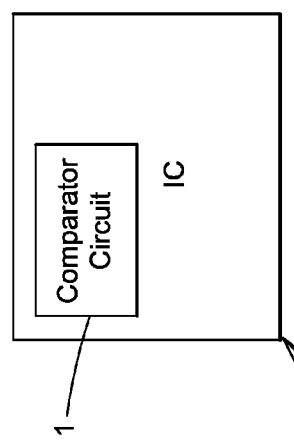

HIGH-SPEED LATCHED COMPARATOR CIRCUIT WITH VARIABLE POSITIVE FEEDBACK

TECHNICAL FIELD

The present invention relates to a latched comparator circuit.

BACKGROUND

Latched comparator circuits are used in various types of electronic circuitry, e.g. for comparing two input voltages. For example, in an analog-to-digital converter (ADC), one or more latched comparators may be utilized for comparing an input voltage with one or more reference voltages for generating a digital value based on the input voltage. Furthermore, in memory circuits, such as a random-access memory (RAM), e.g. a static RAM (SRAM) or a dynamic RAM (DRAM), or a read-only memory (ROM), a latched comparator may be utilized as or in a sense amplifier of a read-out circuitry of the memory circuit for determining whether a logic '0' or '1' is stored in a memory cell of the memory circuit.

A latched comparator may have a differential output port comprising two output terminals. A latched comparator typically operates in two clock phases; a reset phase and a compare-and-latch phase. During the reset phase, the latched comparator is reset, e.g. by balancing the two output terminals of the latched comparators. During the compare-and-latch phase, the latched comparator is operative to compare the two input voltages and generate a differential output voltage corresponding to a logic '0' or '1' based on the two input voltages.

A latched comparator typically includes one or more cross-coupled transistor pairs, such as a cross-coupled NMOS pair and/or a cross-coupled PMOS pair, operatively connected between two output terminals. The one or more cross-coupled transistor pairs provide a positive feedback loop. The positive feedback loop forces one of the output terminals to a first voltage level, such as the supply voltage, and the other output terminal to another voltage level, such as ground, during the compare phase based on the two input voltages.

A latched comparator may comprise a switch connected between the two output terminals. During the reset phase, the switch is closed for balancing the voltages at the two output terminals, e.g. by forcing the voltages to a common level. Alternatively or additionally, the latched comparator may comprise switches connected between each of the output terminals of the latched comparator and a common reference voltage level, such as the supply voltage or ground. Said switches are closed during the reset phase and open during the compare-and-latch phase.

The operational speed of a latched comparator may be a limiting factor for the operational speed of electronic circuits comprising the latched comparator. For example, the operational speed of a latched comparator may be a limiting factor for the maximum sampling frequency of an ADC comprising the latched comparator. As another example, the operational speed of a latched comparator utilized for sense amplification in a memory circuit may be a limiting factor for the maximum read-out rate of the memory circuit. Hence, there is a need for a latched comparator circuit having an improved operational speed.

SUMMARY

An object of the present invention is to provide an improved latched comparator circuit.

According to a first aspect, a latched comparator circuit is provided. The latched comparator circuit comprises a first and a second output terminal for outputting a first and a second output voltage, respectively, of the latched comparator circuit. Furthermore, the latched comparator circuit comprises a cross-coupled pair of transistors operatively connected between the first and the second output terminal for providing a positive feedback in the latched comparator circuit. In addition, the latched comparator circuit comprises a reset terminal for receiving a reset signal and reset circuitry arranged to balance the first and the second output voltage during a first phase of the reset signal and allow a voltage difference to develop between the first and the second output voltage during a second phase of the reset signal. Moreover, the latched comparator circuit comprises a load unit operatively connected to the cross-coupled pair of transistors, and a bias circuit arranged to receive the reset signal and to bias the load unit such that a conductivity of the load unit is higher during the second phase of the reset signal than during the first phase of the reset signal, whereby said positive feedback is stronger during the second phase of the reset signal than during the first phase of the reset signal.

The reset circuitry may be a reset switch device operatively connected between the first and the second output terminal. The reset switch device may be arranged to be closed during the first phase of the reset signal and open during a second phase of the reset signal.

The load unit may comprise a first load circuit operatively connected between a first transistor of the cross-coupled pair of transistors and a reference node and a second load circuit operatively connected between a second transistor of the cross-coupled pair of transistors and the reference node. The bias circuit may be arranged to bias the first and the second load circuit such that a conductivity of the first load circuit and a conductivity of the second load circuit are higher during the second phase of the reset signal than during the first phase of the reset signal.

The first and second transistors of the cross-coupled pair may be MOS transistors of the same type.

The first load circuit may comprise a first load transistor of the same type as the first transistor of the cross-coupled pair. The drain terminal of the first load transistor may be operatively connected to the source terminal of the first transistor of the cross-coupled pair, the source terminal of the first load transistor may be operatively connected to the reference node, and the gate terminal of the first load transistor may be arranged to receive a bias voltage. Similarly, the second load circuit may comprise a second load transistor of the same type as the second transistor of the cross-coupled pair. The drain terminal of the second load transistor may be operatively connected to the source terminal of the second transistor of the cross-coupled pair, the source terminal of the second load transistor may be operatively connected to the reference node, and the gate terminal of the second load transistor may be arranged to receive a bias voltage.

The bias circuit may comprise a first MOS transistor of opposite type to the first and second load transistor. The first MOS transistor may be arranged to be biased with a dc voltage on its gate terminal. Furthermore, the bias circuit may comprise a bias-voltage generating transistor of the same type as the first and second load transistor. The gate terminal of the bias-voltage generating transistor may be operatively connected to the drain terminal of the first MOS transistor and the source terminal of the bias-voltage generating transistor may be operatively connected to the reference node. Moreover, the bias circuit may comprise a switch device operatively connected between the drain and gate terminals of the bias-voltage generating transistor. The switch device may be arranged to be closed during the first phase of the reset signal and open during the second phase of the reset signal. The bias circuit may be arranged to generate the bias voltage for the first and the second load transistor on the gate terminal of the bias-voltage generating transistor.

The load unit may comprise a first load element operatively connected to a first transistor of the cross-coupled pair of transistors with a first terminal of the first load element and to a reference node with a second terminal of the first load element. Similarly, the load unit may comprise a second load element operatively connected to a second transistor of the cross-coupled pair of transistors with a first terminal of the second load element and to the reference node with a second terminal of the second load element. Moreover, the load unit may comprise a third load element operatively connected between the first terminal of the first load element and the first terminal of the second load element. The bias circuit may be arranged to bias the third load element such that a conductivity of the third load element is higher during the second phase of the reset signal than during the first phase of the reset signal.

The third load element may comprise a MOS transistor arranged to receive a bias voltage from the bias circuit on its gate terminal. The bias circuit may comprise a first MOS transistor of opposite type to the MOS transistor of the third load element. Said first MOS transistor may be arranged to be biased with a dc voltage on its gate terminal. Furthermore, the bias circuit may comprise a bias-voltage generating transistor of the same type as the MOS transistor of the third load element. The gate terminal of the bias-voltage generating transistor may be operatively connected to the drain terminal of the first MOS transistor and the source terminal of the bias-voltage generating transistor may be operatively connected to a reference node. Moreover, the bias circuit may comprise a switch device operatively connected between the drain and gate terminals of the bias-voltage generating transistor. The switch device may be arranged to be closed during the first phase of the reset signal and open during the second phase of the reset signal. The bias circuit may be arranged to generate the bias voltage for the MOS transistor of the third load element on the gate terminal of the bias-voltage generating transistor.

According to a second aspect, an electronic circuit comprises a latched comparator circuit according to the first aspect. In the electronic circuit, the latched comparator circuit may be arranged to generate a differential output signal of the latched comparator circuit on the first and second output terminals of the latched comparator circuit. Alternatively, the latched comparator circuit may be arranged to generate a single-ended output signal of the latched comparator circuit on one of the first and second output terminals of the latched comparator circuit. The electronic circuit may e.g. be, but is not limited to, an analog-to-digital converter or a memory circuit.

According to a third aspect, an integrated circuit comprises a latched comparator circuit according to the first aspect.

According to a fourth aspect, an electronic apparatus comprises a latched comparator circuit according to the first aspect. The electronic apparatus may e.g. be, but is not limited to, a television set, a liquid-crystal display, a computer monitor, a digital camera, a projector, or a radio receiver.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which:

FIGS. 5a and b are block diagrams of electronic circuits according to embodiments;

FIG. 6 illustrates schematically an integrated circuit according to an embodiment; and FIG. 7 illustrates schematically an electronic apparatus according to an embodiment.

DETAILED DESCRIPTION

Figure 1:
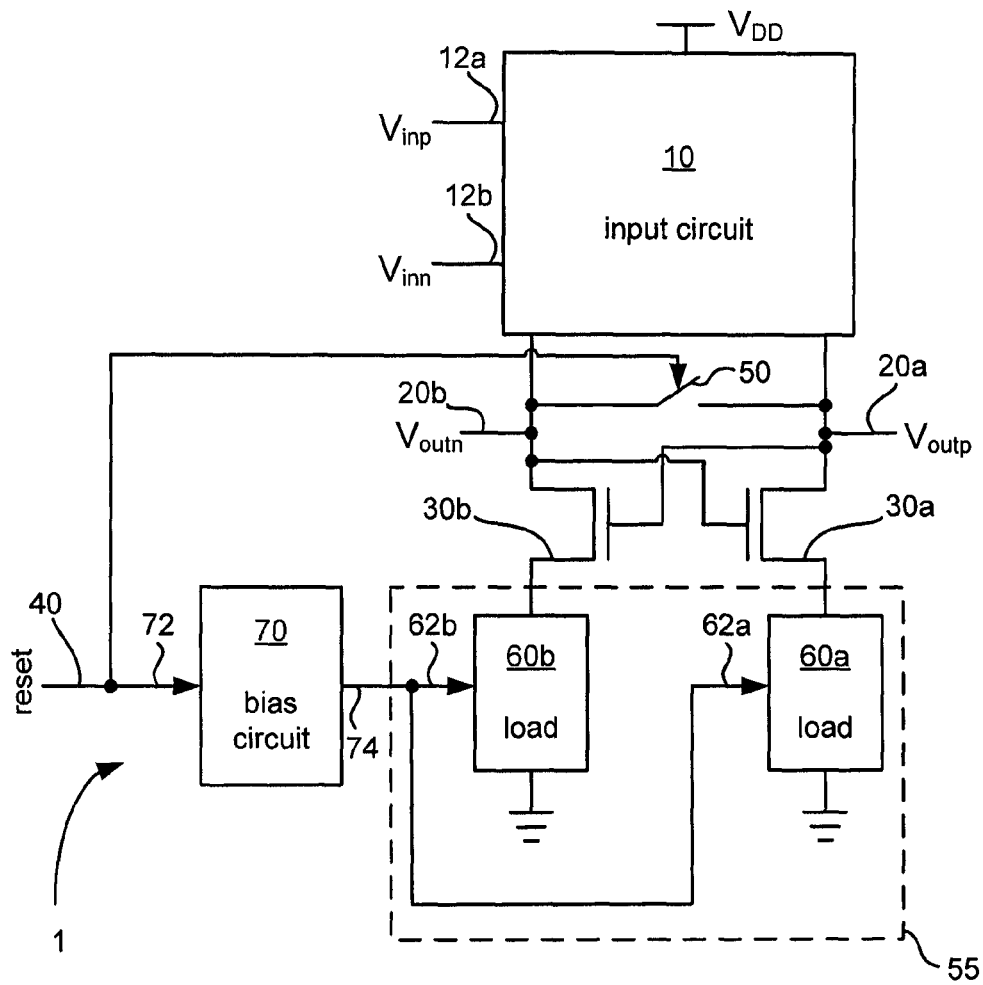
FIGS. 1-4 are circuit diagrams of latched comparator circuits according to embodiments.

FIG. 1 is a circuit diagram of a latched comparator circuit 1 according to an embodiment. According to the embodiment, the latched comparator circuit 1 comprises an input circuit 10. The input circuit 10 has a positive and a negative input terminal 12a and 12b for receiving a positive input voltage $V_{inp}$ and a negative input voltage $V_{inn}$, respectively. Hence, according to the embodiment, the latched comparator circuit is arranged to receive a differential input voltage $V_{inp}$-$V_{inn}$. According to other embodiments, a single-ended input voltage may be used, e.g. by means of connecting one of the input terminals 12a and 12b to a constant voltage and use the other as a single-ended input terminal. The input circuit 10 may be connected to a reference node, such as a supply-voltage node $V_{DD}$, as indicated in FIG. 1.

Furthermore, according to the embodiment illustrated in FIG. 1, the latched comparator circuit 1 comprises a positive and a negative output terminal 20a and 20b for outputting a positive output voltage $V_{outp}$ and a negative output voltage $V_{outn}$, respectively, of the latched comparator circuit 1. Hence, according to the embodiment, the latched comparator circuit 1 is arranged to output a differential output voltage $V_{outp}$-$V_{outn}$. According to some embodiments, one of the output terminals 20a and 20b may be utilized as a single-ended output terminal, e.g. in an electronic circuit comprising the latched comparator circuit 1.

Furthermore, according to the embodiment illustrated in FIG. 1, the latched comparator circuit 1 comprises a cross-coupled pair of transistors 30a and 30b operatively connected between the first and the second output terminal 20a and 20b. In the embodiment illustrated in FIG. 1, the transistors 30a and 30b are both NMOS transistors. According to other embodiments, the transistors 30a and 30b may both be PMOS transistors. According to yet other embodiments, other types of transistors, such as but not limited to bipolar junction transistors (BJTs) may be used. Moreover, according to the embodiment, the latched comparator circuit 1 comprises a reset terminal 40 for receiving a reset signal. The latched comparator circuit 1 is adapted to be reset in a first phase of the reset signal. Furthermore, the latched comparator circuit 1 is adapted to perform a compare-and-latch operation during a second phase of the reset signal.

According to embodiments, the latched comparator circuit 1 comprises reset circuitry arranged to balance the positive and the negative output voltage $V_{outp}$ and $V_{outn}$ during the first phase of the reset signal, e.g. by causing the positive output voltage $V_{outp}$ and the negative output voltage $V_{outn}$ to be equal or approximately equal. Furthermore, the reset circuitry is arranged to allow a voltage difference to develop between the positive and the negative output voltage $V_{outp}$ and $V_{outn}$ during the second phase of the reset signal. According to the embodiment illustrated in FIG. 1, the reset circuitry is a reset switch device (50) operatively connected between the positive and the negative output terminal 20a and 20b. The reset switch device 50 may be arranged to be closed during the first phase of the reset signal for balancing the positive and the negative output voltage $V_{outp}$ and $V_{outn}$. Furthermore, the reset switch device 50 may be arranged to be open during the second phase of the reset signal, thereby allowing a voltage difference to develop between the positive and the negative output voltage $V_{outp}$ and $V_{outn}$.

A cross-coupled pair of transistors, such as the cross-coupled pair of transistors 30a and 30b in FIG. 1, provides a positive feedback loop in a latched comparator circuit. In accordance with embodiments of the present invention, problems for obtaining an increased operational speed have been identified in conventional latched comparator circuits. A strong positive feedback is desirable in the feedback loop in order for a latched comparator circuit to settle quickly during the compare-and-latch operation. However, with a strong positive feedback, a conventional latched comparator circuit becomes difficult to reset. Reset circuitry, such as a reset switch device like the reset switch device 50 in FIG. 1, needs to overcome the positive feedback in order to balance the output voltages. If the positive feedback is relatively strong, a relatively low on resistance is required in such a reset switch device. The reset switch device may e.g. be implemented with a MOS (Metal Oxide Semiconductor) transistor. To obtain a relatively low on resistance, the width-over-length (W/L) ratio of the MOS transistor can be made relatively large. For example, a relatively wide transistor of minimum or close to minimum length (for a given manufacturing process) can be used. However, a relatively wide transistor provides relatively large parasitic capacitances, which in turn slow down the operation of the latched comparator circuit during the compare-and-latch operation. In addition, the wider the transistor in the reset switch device is made, the larger the problem with channel charge injection from the reset switch device becomes. That is, the wider the transistor is, the larger is the channel charge. Channel-charge injection from the reset switch device may lead to erroneous comparison results in the latched comparator circuit, especially when the difference between the input voltages is relatively small.

To alleviate the above problems, a load unit 55 is comprised in the latched comparator circuit 1 according to embodiments. As illustrated in FIG. 1, the load unit 55 may be operatively connected to the cross-coupled pair of transistors. Furthermore, according to embodiments, the latched comparator circuit 1 comprises a bias circuit 70. According to embodiments, the bias circuit 70 is arranged to receive the reset signal and to bias the load unit 55 such that a conductivity of the load unit 55 is higher during the second phase of the reset signal than during the first phase of the reset signal. Thereby, as will be illustrated with reference to specific embodiments, said positive feedback can be made stronger during the second phase of the reset signal than during the first phase of the reset signal. As a consequence, a combination of a relatively fast reset and a relatively fast settling during the compare-and-latch operation is facilitated.

According to the embodiment illustrated in FIG. 1, load circuits 60a and 60b are comprised in the load unit 55. In this embodiment, the load circuit 60a is operatively connected between the transistor 30a of the cross-coupled pair of transistors and a reference node. In the embodiment, the reference node is a ground node. However, in other embodiments, the reference node may be a node having another voltage, such as but not limited to a $V_{DD}$ node. Similarly, the load circuit 60b is operatively connected between the transistor 30b of the cross-coupled pair of transistors and the reference node. Furthermore, according to the embodiment illustrated in FIG. 1, the bias circuit 70 is arranged to receive the reset signal on an input terminal 72 and to bias the load circuits 60a and 60b. A bias control signal is supplied to bias terminals 62a and 62b of the load circuits 60a and 60b, respectively, via a bias output terminal 74 of the bias circuit 70. In FIG. 1, the load circuits 60a and 60b are biased with the same bias control signal. According to other embodiments, the bias circuit 70 may have separate bias output terminals for the load circuits 60a and 60b. By biasing the load circuits 60a and 60b differently in the first phase of the reset signal than in the second phase of the reset signal, the problems with the contradictory requirements of fast reset and fast settling during compare-and-latch operations, associated with a conventional latched comparator circuit, can be alleviated.

During a compare-and latch operation, the load circuits 60a and 60b can be biased such that a conductivity of the load circuit 60a and a conductivity of the load circuit 60b are relatively high. Thereby, a relatively strong positive feedback is obtained. As a consequence, a relatively fast settling of the latched comparator circuit 1 during compare-and-latch operations is facilitated.

During reset of the latched comparator circuit 1, the load circuits 60a and 60b can be biased such that said conductivities are relatively low. Thereby, a relatively weak positive feedback is obtained. As a consequence, the latched comparator circuit I can be reset relatively quickly. Furthermore, since the positive feedback during reset is relatively weak, the width of a transistor used for implementing the reset switch device 50 can be made relatively small, which in turn reduces the problems with parasitic capacitance and channel-charge injection from the reset switch device.

Therefore, in accordance with embodiments, the bias circuit 70 is arranged to bias the load circuits 60a and 60b such that the conductivity of the load circuit 60a and the conductivity of the load circuit 60b are higher during the second phase of the reset signal than during the first phase of the reset signal.

Figure 2:
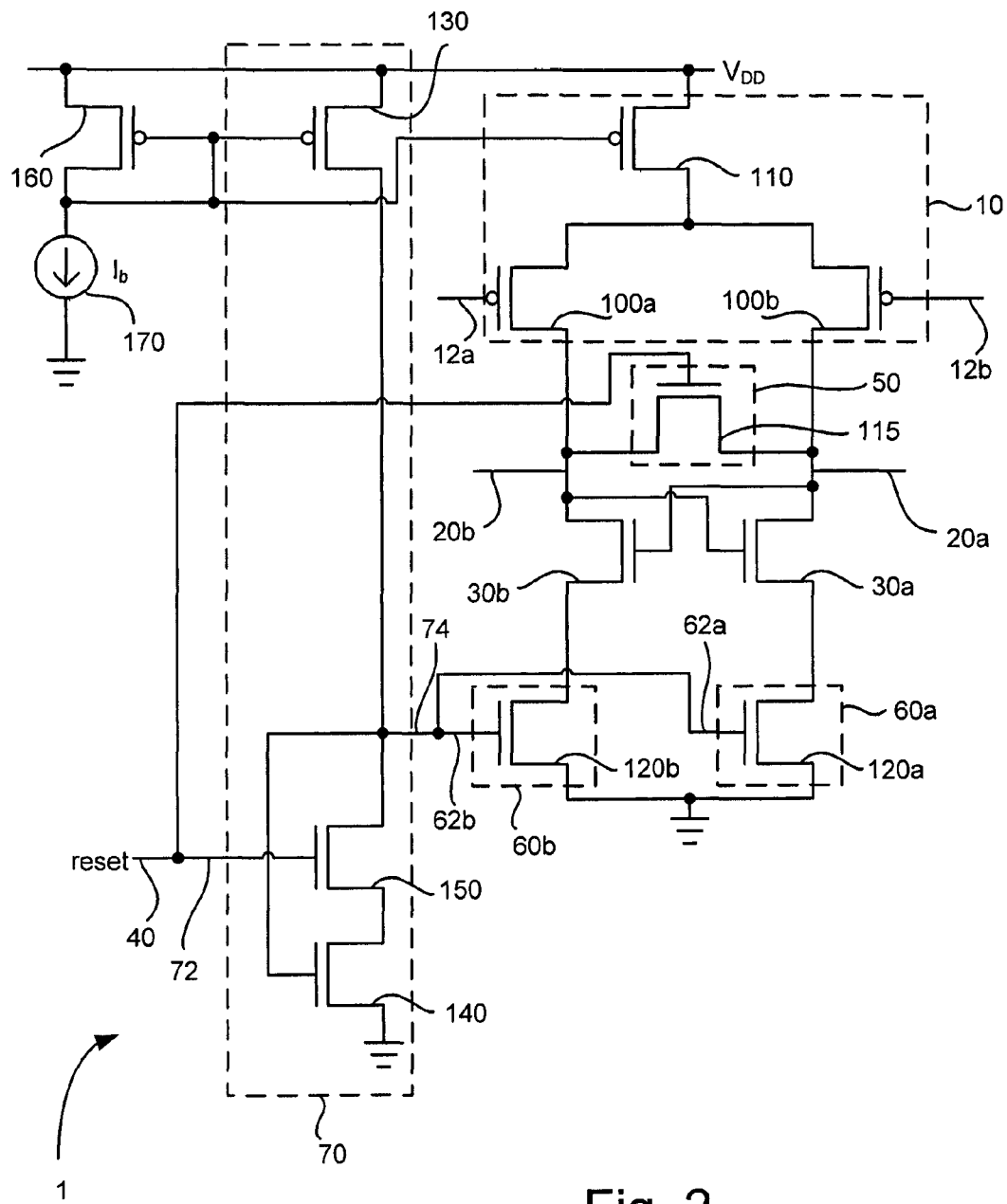

FIG. 2 is a more detailed circuit diagram of the latched comparator circuit I illustrated in FIG. 1 according to an embodiment. According to the embodiment, the cross-coupled pair of transistor comprises NMOS transistors 30a and 30b. Furthermore, the input circuit 10 comprises a differential transistor pair for receiving the differential input voltage of the latched comparator circuit 1. In the embodiment illustrated in FIG. 2, the transistors 100a and 100b of the differential transistor pair are PMOS transistors. Furthermore, according to the embodiment illustrated in FIG. 2, the transistors 100a and 100b are biased with a current generated by the PMOS transistor 110.

Moreover, in the embodiment illustrated in FIG. 2, the reset switch device comprises an NMOS transistor 115 connected between the output terminals 20a and 20b. Various other implementations of the reset switch device 50 are also possible. For example, according to some embodiments, the reset switch device 50 may comprise a PMOS transistor. According to some embodiments, the reset switch device 50 may comprise a transmission gate. The transmission gate may e.g. be implemented with a PMOS transistor connected in parallel with an NMOS transistor.

According to the embodiment illustrated in FIG. 2, the load circuit 60a comprises a transistor 120a and the load circuit 60b comprises a transistor 120b. The transistors 120a and 120b are in the following referred to as load transistors. In the embodiment illustrated in FIG. 2, the load transistors 120a and 120b are of the same type as the transistors 30a and 30b, i.e. NMOS transistors.

The drain terminal of the load transistor 120a is operatively connected to the source terminal of the transistor 30a. Similarly, the drain terminal of the load transistor 120b is operatively connected to the source terminal of the transistor 30b. The source terminals of the load transistors 120a and 120b are operatively connected to ground. The gate terminals of the load transistors 120a and 120b are arranged to receive bias voltages. In FIG. 2, the load transistors 120a and 120b are arranged to receive the same bias voltage. According to other embodiments, the load transistors 120a and 120b may be arranged to be biased separately.

In the embodiment illustrated in FIG. 2, the bias circuit 70 comprises a PMOS transistor 130. The transistor 130 is arranged to be biased with a dc voltage on its gate terminal. The bias circuit 70 further comprises a transistor 140 for generating a bias voltage. In the embodiment, the transistor 140 is of the same type as the load transistors 120a and 120b, i.e. NMOS transistors. The gate terminal of the transistor 140 is operatively connected to the drain terminal of the transistor 130. The source terminal of the transistor 140 is operatively connected to ground.

Furthermore, according to the embodiment illustrated in FIG. 2, the bias circuit 70 comprises a switch device 150 operatively connected between the drain and gate terminals of the transistor 140. As illustrated in FIG. 2, the switch device 150 may be implemented with a transistor, such as but not limited to an NMOS transistor. The switch device 150 is arranged to be closed during the first phase of the reset signal. Furthermore, the switch device 150 is arranged to be open during the second phase of the reset signal.

For the embodiment illustrated in FIG. 2, the bias circuit 70 is arranged to generate the bias voltage for the load transistor 120a and 120b on the gate terminal of the transistor 140.

A means for biasing the transistor 130 is illustrated in FIG. 2. The transistor 130 is connected in a current-mirror configuration with a diode-connected transistor 160, which in turn is biased by a current $I_b$ from a current source 170. As an example, which is also illustrated in FIG. 2, the transistor 110 may be biased with the same gate voltage as the transistor 130. According to some embodiments, the transistors 130 and 110 may be biased separately.

When the reset signal is high, the switch device 150 and the reset switch device 50 are both closed. A current generated by the transistor 130 flows through the switch device 150 and the transistor 140. Due to the connection of the gate terminal of the transistor 140, this current is mirrored to the load transistors 120a and 120b. By properly selecting transistor sizes and bias currents, the gate-to-source voltages ($V_{GS}$) of the load transistors 120a and 120b can be set such that the channel charges of the load transistors 120a and 120b are relatively small. Thereby, the conductivities of the load circuits 60a and 60b may be set relatively small, which is advantageous for facilitating a relatively fast reset of the latched comparator circuit 1.

When the reset signal goes low, the reset switch device 50 is opened. Thereby, a voltage difference is allowed to develop between the output terminals 20a and 20b based on a voltage difference between the input terminals 12a and 12b. Furthermore, the switch device 150 is opened. Thereby, the current from the transistor 130 is prevented from flowing through the transistor 140. Instead, capacitance associated with the gate node of the transistor 140 is charged and the voltage on that node (i.e. the bias voltage for the load transistors 120a and 120b) gradually increases towards the supply voltage $V_{DD}$. Hence, the $V_{GS}$ of the load transistors 120a and 120b gradually increases, which causes a gradual increase of the channel charges of these transistors. Thereby, the conductivities of the load circuits 120a and 120b are increased. This, in turn, causes an increased strength of the positive feedback loop in the latch circuit 1, whereby relatively fast settling of the latched comparator circuit 1 during the compare-and-latch operation is facilitated.

A circuit designer could e.g. determine how fast the gradual increase of the $V_{GS}$ of the transistor 140 should be based on a trade-off between speed and accuracy. For example, if the speed of the gradual increase is increased, the strength of the positive feedback increases faster, whereby a faster settling is obtained. On the other hand, a smaller voltage difference is allowed to develop between the output terminals 20a and 20b before the strong positive feedback is attained, whereby the accuracy is reduced. Similarly, if the speed of the gradual increase is decreased, a larger voltage difference is allowed to develop between the output terminals 20a and 20b before the strong positive feedback is attained, whereby the accuracy is increased. However, at the same time, the strength of the positive feedback increases slower, whereby a slower settling is obtained. An appropriate speed for the gradual increase, and associated appropriate transistor dimensions, bias currents etc., may e.g. be determined by means of circuit simulation.

When the reset signal once again goes high, current is again allowed to pass through the transistor 140, whereby the capacitance associated with the gate node of the transistor 140 is discharged. Thereby the conductivities of the load circuits 120a and 120b are decreased, whereby a relatively fast reset of the latched comparator circuit is facilitated.

Figure 3:
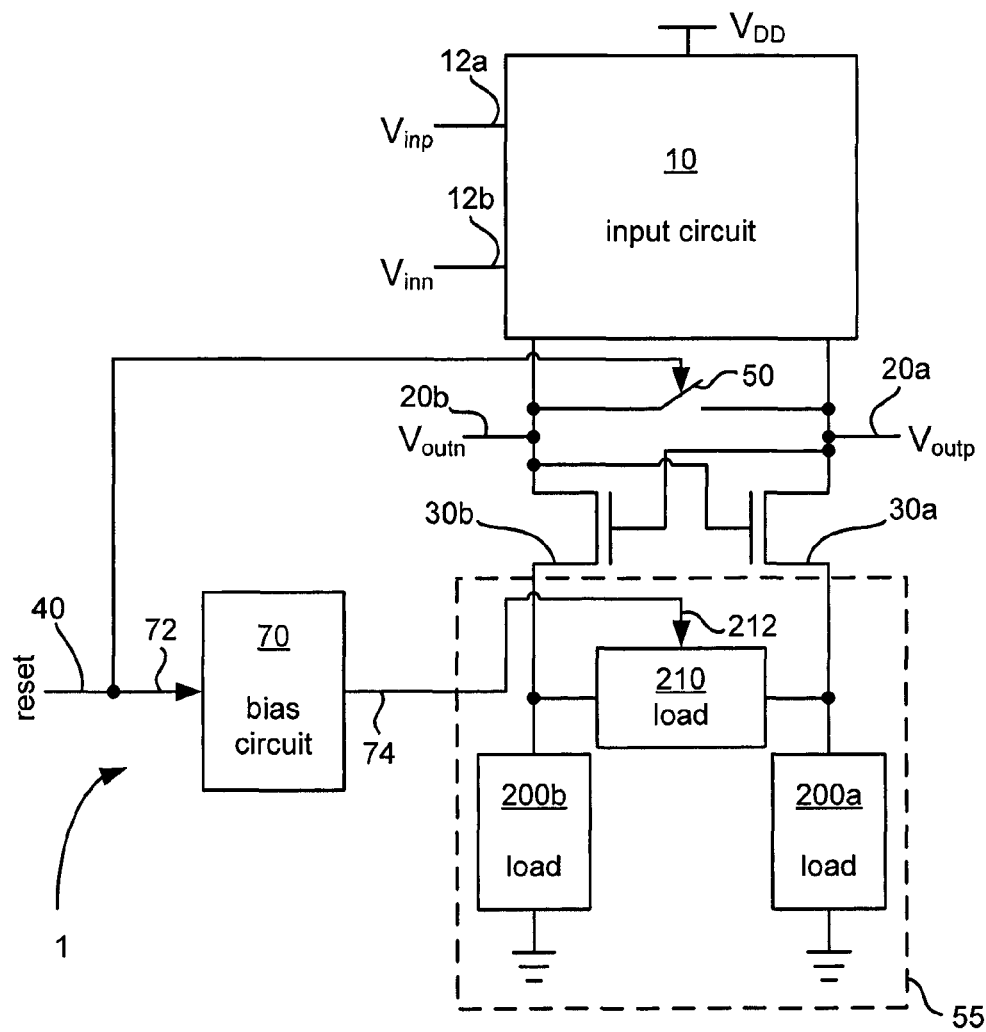

FIG. 3 is a circuit diagram of the latched comparator circuit 1 according to another embodiment. Elements that are the same or similar as elements illustrated in FIG. 1 are denoted with the same reference signs in FIG. 3 as in FIG. 1. A difference between the embodiment illustrated in FIG. 3 and the embodiment illustrated in FIG. 1 is related to elements comprised in the load unit 55. In FIG. 3, the load unit 55 comprises a load circuit, or load element, 200a operatively connected to the transistor 30a with a first terminal of the load element 200a and to a reference node with a second terminal of the first load element (200a). In FIG. 3, the reference node is a ground node. However, in other embodiments, a reference node other than ground may be used. Furthermore, in FIG. 3, the load unit 55 comprises a load circuit, or load element, 200b operatively connected to the transistor 30b with a first terminal of the load element 200b and to the reference node with a second terminal of the load element 200b. Moreover, in FIG. 3, the load unit 55 comprises a load circuit, or load element, 210 operatively connected between the first terminal of the load element 200a and the first terminal of the load element 200b. For the embodiment illustrated in FIG. 3, the bias circuit 70 is arranged to bias the load element 210 such that a conductivity of the load element 210 is higher during the second phase of the reset signal than during the first phase of the reset signal. Thereby, a relatively strong positive feedback may be obtained during a compare-and-latch operation, while a relatively weak positive feedback may be obtained during a reset operation. As a consequence, a relatively fast settling of the latched comparator circuit 1 during compare-and-latch operations is facilitated, while the latched comparator circuit 1 can be reset relatively quickly. Furthermore, since the positive feedback during reset is relatively weak, the width of a transistor used for implementing the reset switch device 50 can be made relatively small, which in turn reduces the problems with parasitic capacitance and channel-charge injection from the reset switch device.

Figure 4:
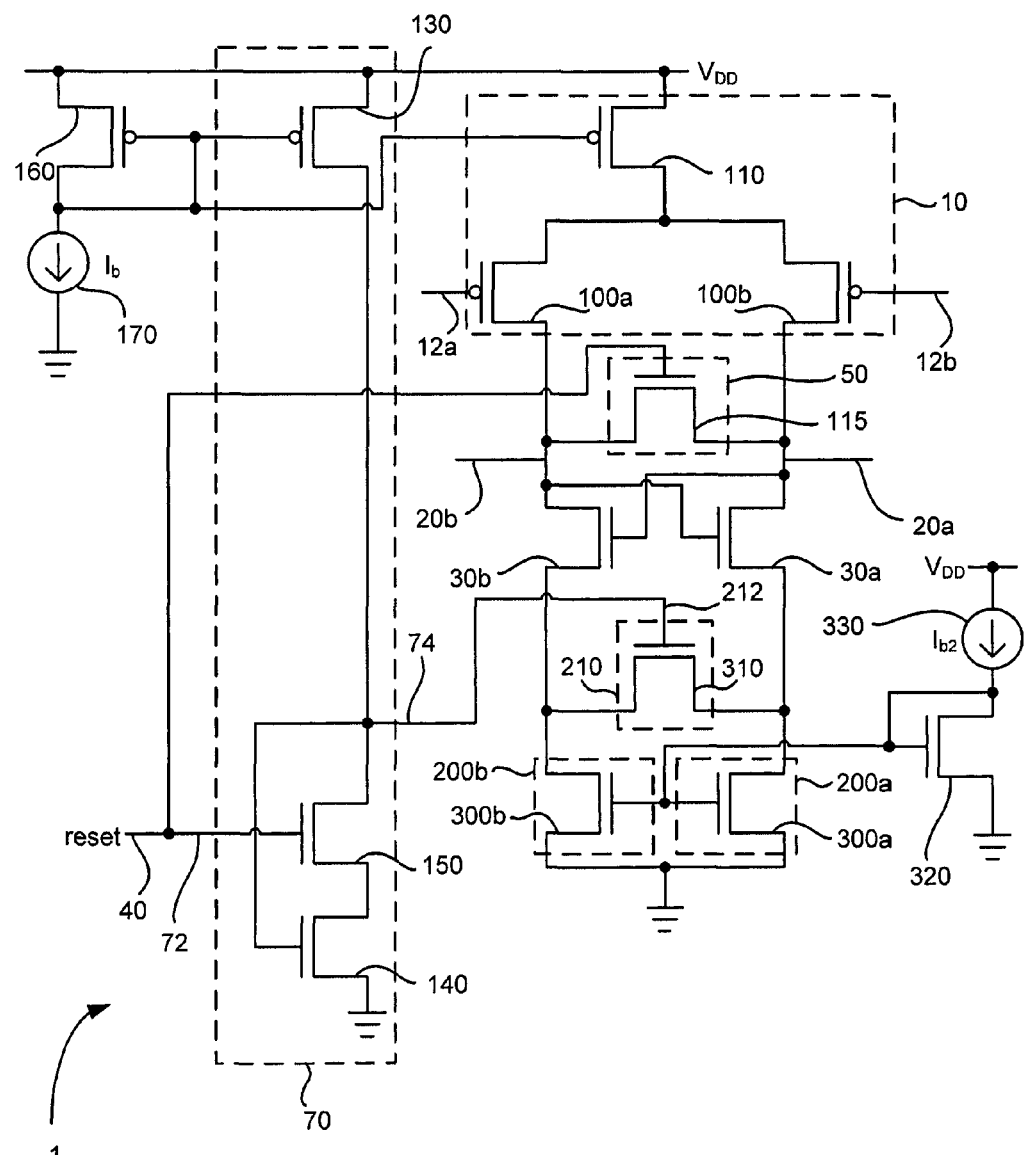

FIG. 4 is a more detailed circuit diagram of the latched comparator circuit 1 illustrated in FIG. 3 according to an embodiment. Elements that are the same or similar to elements in FIG. 2 are denoted with the same reference signs in FIG. 4 as in FIG. 2. According to the embodiment illustrated in FIG. 4, the load element 210 comprises a MOS transistor 310 arranged to receive a bias voltage from the bias circuit 70 on its gate terminal. The channel charge, and hence the conductivity, of the MOS transistor may be controlled by means of the bias voltage on the gate terminal of the MOS transistor 310. According to embodiments, the MOS transistor 310 is of the same type as the transistor 140. For example, in FIG. 4, both the transistor 140 and the transistor 310 are of NMOS type.

In FIG. 4, the bias circuit 70 is implemented in the same way as in FIG. 2. When the reset signal is high, the switch device 150 and the reset switch device 50 are both closed. A current generated by the transistor 130 flows through the switch device 150 and the transistor 140 and determines the bias voltage on the bias output terminal 74. By properly selecting transistor sizes and bias currents, the electrical potential on the gate terminal of the transistor 310 can be set such that the channel charge of the transistor 310 is relatively small during the first phase of the reset signal. Thereby, the conductivity of the load element 210 may be set relatively small, which is advantageous for facilitating a relatively fast reset of the latched comparator circuit 1.

When the reset signal goes low, the reset switch device 50 is opened. Thereby, a voltage difference is allowed to develop between the output terminals 20a and 20b based on a voltage difference between the input terminals 12a and 12b. Furthermore, the switch device 150 is opened. Thereby, the current from the transistor 130 is prevented from flowing through the transistor 140. Instead, capacitance associated with the gate node of the transistor 140 is charged and the voltage on that node (i.e. the bias voltage for the transistor 310) gradually increases towards the supply voltage $V_{DD}$. Hence, gate potential of the transistor 310 gradually increases, which causes a gradual increase of the channel charge of the transistor 310. Thereby, the conductivity of the load element 210 is increased. This, in turn, causes an increased strength of the positive feedback loop in the latch circuit 1, whereby relatively fast settling of the latched comparator circuit 1 during the compare-and-latch operation is facilitated.

Also for the embodiment illustrated in FIG. 4, a circuit designer may e.g. determine how fast the gradual increase of the $V_{GS}$ of the transistor 140 should be based on the same or similar design consideration as was described with reference to FIG. 2.

In FIG. 4, the load element 200a comprises a transistor 300a connected with its source terminal to ground and with its drain terminal to the source terminal of the transistor 30a. Similarly, in FIG. 4, the load element 200b comprises a transistor 300b connected with its source terminal to ground and with its drain terminal to the source terminal of the transistor 30b. As illustrated in the figure, the transistors 300a and 300b may be NMOS transistors.

Furthermore, in the embodiment illustrated in FIG. 4, the transistors 300a and 300b are biased with a common gate-to-source voltage generated by a transistor 320 of the same type as the transistors 300a and 300b and configured in a current-mirror configuration with the transistors 300a and 300b. As illustrated in FIG. 4, the transistor 320 may be biased with a DC current $I_{b2}$ generated by a current source unit 330.

According to some embodiments, the embodiments of load circuit 55 illustrated in FIGS. 1 and 3 may be combined. For example, starting from the embodiment illustrated in FIG. 1, the load element 210 of the embodiment illustrated in FIG. 3 may be further included in the load unit 55 and operatively connected between source terminals of the transistors 30a and 30b. The bias circuit 70 may then be arranged to control the conductivities of all of the load circuits 60a and 60b and the load element 210. Similarly, with reference to FIGS. 2 and 4, the NMOS transistor 310 in the embodiment illustrated in FIG. 4 may be operatively connected between the drain terminals of the load transistors 120a and 120b of the embodiment illustrated in FIG. 2. The gate terminals of the transistors 120a-b and 310 may then e.g. all be connected to the bias output terminal 74 of the bias circuit 70.

Values of transistor sizes, bias currents, etc. may be selected for each implementation, e.g. based on requirements for a given application in which the latch circuit 1 is to be used (e.g. requirements on speed, power consumption, etc.), process parameters for a given manufacturing process, etc. The selection may e.g. be based on simulations and/or measurements.

The circuit diagrams shown in FIGS. 1-4 are only illustrations of example embodiments. Various variations are possible within the scope of the invention. For example, complementary circuits, where all NMOS transistors are replaced with PMOS transistors, all PMOS transistors are replaced with NMOS transistors, and all connections to $V_{DD}$ and ground are interchanged, may be employed. Furthermore, other types of transistors than MOS transistors, such as BJTs, may be used. For example one or more of the NMOS transistors may be replaced with NPN transistors. Similarly, one or more of the PMOS transistors may be replaced with PNP transistors. Moreover, the transistor 140 in FIG. 2 and FIG. 4 could e.g. be replaced with a resistor connected between ground and the source terminal of the transistor 150. Similarly, the transistors 300a and 300b in FIG. 4 could e.g. be replaced with resistors connected between ground and the source terminals of the transistors 30a and 30b, respectively.

Furthermore, intervening elements (e.g. cascode transistors, resistors, etc.) may be inserted between elements that are illustrated as directly connected in FIGS. 1-4.

An electronic circuit 400 may comprise the latched comparator circuit 1 according to embodiments. This is schematically illustrated in FIGS. 5a and b, showing an electronic apparatus 400 comprising a latched comparator circuit 1, units 410a and 410b for supplying input signals to the latched comparator circuit 1, a processing unit 420 for processing data output from the latched comparator circuit, and a control unit 430 for controlling the reset of the latched comparator circuit 1. In some embodiments, the latched comparator circuit 1 may be arranged in the electronic circuit 400 to generate a differential output signal of the latched comparator circuit 1 on the output terminals 20a and 20b of the latched comparator circuit 1. This is illustrated in FIG. 5a, where the processing unit 420 is connected to both of the output terminals 20a and 20b of the latched comparator circuit 1. According to some embodiments, the latched comparator circuit 1 is arranged in the electronic circuit 400 to generate a single-ended output signal of the latched comparator circuit 1 on one of the output terminals 20a and 20b of the latched comparator circuit 1. This is illustrated in FIG. 5b, where the processing unit 420 is connected only to the output terminal 20a of the latched comparator circuit 1, whereas the output terminal 20b of the latched comparator circuit is left unconnected.

A nonlimiting example of an electronic circuit 400 that may comprise one or more latched comparator circuits 1 is an analog-to-digital converter (ADC). The latched comparator circuit 1 may e.g. be connected in a comparator arrangement of the ADC. The comparator arrangement may be adapted to compare an analog input signal of the ADC, or a signal derived therefrom, with one or more reference levels of the ADC for generating a digital output signal of the ADC based on the analog input signal. The comparator arrangement may comprise one or more comparators connected in cascade. Due to the relatively high operational speed provided by the latched comparator circuit 1, it is suitable for use in ADCs for high-speed applications, such as but not limited to video applications. In some video applications, ADC sampling rates up to 270 MHz or even higher may be required.

Another nonlimiting example of an electronic circuit 400 that may comprise the latched comparator circuit 1 is a memory circuit. The memory circuit may e.g. be a random access memory (RAM) such as a static RAM (SRAM) or a dynamic RAM (DRAM), or a read-only memory (ROM). For example, one or more latched comparator circuits 1 may be comprised in sense-amplification circuitry of the memory circuit. Due to the relatively high operational speed of the latched comparator circuit 1, a relatively high read-out rate may thereby be accomplished in the memory circuit.

According to some embodiments, an integrated circuit (IC) comprises the latched comparator circuit 1. This is schematically illustrated in FIG. 6, showing an IC 500 comprising a latched comparator circuit 1. For example, the IC 500 may comprise an ADC and/or a memory circuit that in turn comprise one or more latched comparator circuits 1.

According to some embodiments, an electronic apparatus comprises one or more latched comparator circuits 1. This is schematically illustrated in FIG. 7, showing an electronic apparatus 510 comprising a latched comparator circuit 1. For example, the electronic apparatus 510 may comprise an ADC, a memory circuit, and/or an integrated circuit that in turn comprise one or more latched comparator circuits 1.

The electronic apparatus 510 may e.g. be, but is not limited to, a television set, a liquid-crystal display, a computer monitor, a digital camera, a projector, or a radio receiver.

According to some embodiments, a method of operating the latched comparator circuit 1 is provided. During the first phase of the reset signal, embodiments of the method comprises biasing the load unit 50 in a first state and balancing the positive and the negative output voltages $V_{outp}$ and $V_{outn}$. During the second phase of the reset signal, embodiments of the method comprises biasing the load unit 50 in a second state, in which a conductivity of the load unit 50 is higher than in the first state, and allowing a voltage difference to develop between the positive and the negative output voltage $V_{outp}$ and $V_{outn}$. Thereby, as described above, the positive feedback can be made stronger during the second phase of the reset signal than during the first phase of the reset signal.

The present invention has been described above with reference to specific embodiments. However, other embodiments than the above described are possible within the scope of the invention. Different method steps than those described above, may be provided within the scope of the invention. The different features and steps of the invention may be combined in other combinations than those described. The scope of the invention is only limited by the appended patent claims.

The invention claimed is:

1. A latched comparator circuit comprising:

a first and a second output terminal for outputting a first and a second output voltage, respectively, of the latched comparator circuit;

a cross-coupled pair of transistors operatively connected between the first and the second output terminal for providing a positive feedback in the latched comparator circuit;

a reset terminal for receiving a reset signal;

reset circuitry arranged to balance the first and the second output voltage during a first phase of the reset signal and allow a voltage difference to develop between the first and the second output voltage during a second phase of the reset signal;

a load unit operatively connected to the cross-coupled pair of transistors; and a bias circuit arranged to receive the reset signal and to bias the load unit such that a conductivity of the load unit is higher during the second phase of the reset signal than during the first phase of the reset signal, whereby said positive feedback is stronger during the second phase of the reset signal than during the first phase of the reset signal;

wherein the load unit comprises a first load circuit operatively connected between a first transistor of the cross-coupled pair of transistors and a reference node, and a second load circuit operatively connected between a second transistor of the cross-coupled pair of transistors and the reference node, wherein the bias circuit is arranged to bias the first and the second load circuit such that a conductivity of the first load circuit and a conductivity of the second load circuit are higher during the second phase of the reset signal than during the first phase of the reset signal;

wherein the first and second transistors of the cross-coupled pair are MOS transistors of the same type;

wherein the first/second load circuit comprises a first/second load transistor of the same type as the first/second transistor of the cross-coupled pair, the first/second load transistor having a drain terminal operatively connected to the source terminal of the first/second transistor of the cross-coupled pair, a source terminal operatively connected to the reference node, and a gate terminal arranged to receive a bias voltage;

wherein the bias circuit comprises:

a first MOS transistor of opposite type to the first and second load transistor, wherein the first MOS transistor is arranged to be biased with a dc voltage on its gate terminal;

a bias-voltage generating transistor of the same type as the first and second load transistor, wherein the gate terminal of the bias-voltage generating transistor is operatively connected to the drain terminal of the first MOS transistor and the source terminal of the bias-voltage generating transistor is operatively connected to the reference node; and a switch device operatively connected between the drain and gate terminals of the bias-voltage generating transistor, wherein the switch device is arranged to be closed during the first phase of the reset signal and open during the second phase of the reset signal; and wherein the bias circuit is arranged to generate the bias voltage for the first and the second load transistor on the gate terminal of the bias-voltage generating transistor.

2. The latched comparator circuit according to claim 1, wherein the reset circuitry is a reset switch device operatively connected between the first and the second output terminal, wherein the reset switch device is arranged to be closed during the first phase of the reset signal and open during a second phase of the reset signal.

3. The latched comparator circuit according to claim 1, wherein the latched comparator circuit is included in an electronic circuit.

4. The latched comparator circuit according to claim 3, wherein the latched comparator circuit is arranged to generate a differential output signal of the latched comparator circuit on the first and second output terminals of the latched comparator circuit.

5. The latched comparator circuit according to claim 3, wherein the latched comparator circuit is arranged to generate a signal-ended output signal of the latched comparator circuit on one of the first and second output terminals of the latched comparator circuit.

6. The latched comparator circuit according to claim 3, wherein the electronic circuit is an analog-to-digital converter or a memory circuit.

7. The latched comparator circuit according to claim 1, wherein the latched comparator circuit is included in an integrated circuit.

8. The latched comparator circuit according to claim 1, wherein the latched comparator circuit is included in an electronic apparatus.

9. The latched comparator circuit according to claim 8, wherein the electronic apparatus is one of a television set, a liquid-crystal display, a computer monitor, a digital camera, a projector, and a radio receiver.

10. A latched comparator circuit comprising:
   a first and a second output terminal for outputting a first and a second output voltage, respectively, of the latched comparator circuit;
   a cross-coupled pair of transistors operatively connected between the first and the second output terminal for providing a positive feedback in the latched comparator circuit;
   a reset terminal for receiving a reset signal;
   reset circuitry arranged to balance the first and the second output voltage during a first phase of the reset signal and allow a voltage difference to develop between the first and the second output voltage during a second phase of the reset signal;
   a load unit operatively connected to the cross-coupled pair of transistors; and
   a bias circuit arranged to receive the reset signal and to bias the load unit such that a conductivity of the load unit is higher during the second phase of the reset signal than during the first phase of the reset signal, whereby said positive feedback is stronger during the second phase of the reset signal than during the first phase of the reset signal;
   wherein the load unit comprises:
   a first load element having a first terminal and a second terminal, the first terminal of the first load element operatively connected to a first transistor of the cross-coupled pair of transistors and the second terminal of the first load element operatively connected to a reference node;
   a second load element having a first terminal and a second terminal, the first terminal of the second load element operatively connected to a second transistor of the cross-coupled pair of transistors and the second terminal of the second load element operatively connected to the reference node; and
   a third load element operatively connected between the first terminal of the first load element and the first terminal of the second load element; and
   wherein the bias circuit is arranged to bias the third load element such that a conductivity of the third load element is higher during the second phase of the reset signal than during the first phase of the reset signal.

11. The latched comparator circuit according to claim 10, wherein the third load element comprises a MOS transistor arranged to receive a bias voltage from the bias circuit on its gate terminal.

12. The latched comparator circuit according to claim 11, wherein the bias circuit comprises:
   a first MOS transistor of the opposite type to the MOS transistor of the third load element, wherein the first MOS transistor is arranged to be biased with a dc voltage on its gate terminal;
   bias-voltage generating transistor of the same type as the MOS transistor of the third load element, wherein the gate terminal of the bias-voltage generating transistor is operatively connected to the drain terminal of the first MOS transistor and the source terminal of the bias-voltage generating transistor is operatively connected to a reference node; and
   a switch device operatively connected between the drain and gate terminals of the bias-voltage generating transistor, wherein the switch device is arranged to be closed during the first phase of the reset signal and open during the second phase of the reset signal;
   wherein the bias circuit is arranged to generate the bias voltage for the MOS transistor of the third load element on the gate terminal of the bias-voltage generating transistor.

13. A latched comparator circuit, comprising:
   a first and a second output terminal for outputting a first and a second output voltage, respectively, of the latched comparator circuit;
   a cross-coupled pair of transistors including a first and second transistor, the cross-coupled pair operatively connected between the first and the second output terminal for providing a positive feedback in the latched comparator circuit;
   a first load transistor and a second load transistor each of the same type as a respective one of the first and second transistor of the cross-coupled pair, the first and second load transistor each having a source terminal operatively connected to a reference node, a drain terminal operatively connected to the source terminal of the respective one of the first and second transistor of the cross-coupled pair, and a gate terminal arranged to receive a bias voltage; and
   a bias circuit including:
   a first MOS transistor of opposite type to the first and second load transistor, the first MOS transistor arranged to be biased with a dc voltage on its gate terminal;
   a bias-voltage generating transistor of the same type as the first and second load transistor, a gate terminal of the bias-voltage generating transistor operatively connected to a drain terminal of the first MOS transistor and a source terminal of the bias-voltage generating transistor operatively connected to the reference node; and
   a switch device operatively connected between the drain and gate terminals of the bias-voltage generating transistor,
   wherein the bias circuit is arranged to generate the bias voltage for the first and the second load transistor on the gate terminal of the bias-voltage generating transistor.

* * * * *